United States Patent [19]
Oae et al.

[11] Patent Number: 5,276,331
[45] Date of Patent: Jan. 4, 1994

[54] ELECTRON BEAM EXPOSURE SYSTEM

[75] Inventors: Yoshihisa Oae; Kiichi Sakamoto, both of Kawasaki, Japan

[73] Assignee: Fujitsu Limited, Kanagawa, Japan

[21] Appl. No.: 968,892

[22] Filed: Oct. 30, 1992

[30] Foreign Application Priority Data

Nov. 6, 1991 [JP] Japan .................................. 3-290231

[51] Int. Cl.$^5$ ............................................ H01J 37/147
[52] U.S. Cl. ............................. 250/396 ML; 250/398; 250/492.2
[58] Field of Search ................................. 250/396, 398

[56] References Cited

U.S. PATENT DOCUMENTS

| | | | |
|---|---|---|---|
| 3,911,321 | 10/1975 | Wardly | 250/396 ML |
| 4,395,691 | 7/1983 | Knauer | 250/396 ML |
| 4,431,915 | 2/1984 | Nakagawa et al. | 250/396 ML |
| 4,766,372 | 8/1988 | Rao | 250/396 ML |
| 4,859,856 | 8/1989 | Groves et al. | 250/398 |
| 4,929,838 | 5/1990 | Yasuda et al. | 250/396 ML |
| 5,051,556 | 9/1991 | Sakamoto et al. | 250/396 ML |

*Primary Examiner*—Bruce C. Anderson
*Attorney, Agent, or Firm*—Nikaido, Marmelstein, Murray & Oram

[57] ABSTRACT

An electron beam exposure system having an electromagnetic lens for forming an electron beam into an arbitrary image and for condensing and projecting the image on a sample, and a plurality of saddle type electromagnetic deflectors for deflecting and scanning the electron beam on the sample, wherein at least one of the plurality of saddle type electromagnetic deflectors has a half angle of arc of more than 60 degrees and positions in a vicinity of a smooth connecting line which links four points plotted on a graph having coordinates of the half angle of arc of 60 degrees to no less than a radius of curvature of 30 millimeters, approximately 61.5 degrees to 14 millimeters, approximately 64 degrees to 9 millimeters, and approximately 66 degrees to 7 millimeters. Thus, the electron beam exposure system having the saddle type electromagnetic deflector and which is small and has low aberration is realized.

9 Claims, 6 Drawing Sheets

ELECTRON BEAM EXPOSURE SYSTEM

BACKGROUND OF THE INVENTION

1. Field of the Invention

The present invention relates to an electron beam exposure system for deflecting and focusing an electron beam and for forming a fine pattern on a sample (semiconductor wafer or the like), and more particularly relates to an electron beam exposure system having a low aberration focusing deflector for realizing a high resolution image.

2. Description of the Related Art

In recent years, simultaneously with a high integration of semiconductor integrated circuit devices, an election beam exposure system has been requested for an increase in throughput and the realization of a high resolution image.

The electron beam exposure system scans an electron beam on a sample and obtains a desired pattern by deflecting the electron beam using a plurality of electromagnetic deflection coils (electromagnetic deflector).

The plurality of coils are separated into two portions (X, Y) in accordance with the scanning directions, and in each portion, the deflection coils are connected in series. The electron beam forms a desired shape, after which it is condensed by a condensing lens and projected onto a sample by a projection lens.

The strength of a lens is determined so that an image of a first rectangular aperture formed at first is obtained on a second rectangular aperture for forming the shape of an electron beam and on a sample; and so that a crossover image is combined on a round aperture. There are no specific conditions regarding the strength of the condensing lens and the projection lens, and a combination thereof to image the electron beam on a sample is necessary.

The resolution of a fine pattern is directly affected by a blurring of the electron beam itself. This is a characteristic of the exposure system and is called aberration. There are two types of aberration, an on axis aberration which occurs on an optical axis regardless of the beam deflection, and a deflecting aberration which is caused by deflection.

The on axis aberration is caused by a characteristic of the electromagnetic lens and occurs regardless of the deflector. Namely, the amount of on axis aberration is determined only by the focusing route to the point where the beam arrives at the sample, and the beam aperture angle when the electron beam enters the sample, i.e., the angle of incidence is proportional to the value. Generally, using half of the angle of incidence ($\alpha$), the aberration is expressed as follows.

Spherical aberration $C_s = k_1 \alpha^3$

Chromatic aberration $C_c = K_2 \alpha \Delta E$ where $\Delta E$ designates a fluctuation of the electron energy emitted from an electron gun. The smaller $\Delta E$ is, the smaller the chromatic aberration is, and most of the aberration on the optical axis is spherical aberration.

When $\alpha$ decreases, the spherical aberration decreases in proportion to $\alpha^3$. Namely, resolution of the electron beam increases in accordance with the reduction of $\alpha$. The value $\alpha$ of half of the aperture angle is determined in accordance with a design of the round aperture, and also the lower limit of the electric current density determines the lower limit of the area of the round aperture, therefore the value $\alpha$ cannot be reduced beyond a certain value.

The deflection aberration is generated by beam deflection using the deflector, and includes components in proportion to a value d of the deflection, $d^2$ and $d^3$. Some of these aberrations cannot be corrected. Hitherto, aberrations which could not be corrected were minimized, and the aberrations which could be corrected were corrected by the design of the deflectors to reduce the aberrations as much as possible.

On the other hand, half the angle of the aperture can be changed without changing the lower limit of the electric current applied to the sample, by changing the strength ratio of the projecting lens and the condensing lens. If the strength of the projecting lens is reduced and the strength of the condensing lens is increased, then half the angle of aperture of the condensing lens having a comparatively large condensing ratio is reduced, and half the angle of aperture of the projecting lens having condensing ratio of approximately 1 is reduced.

By adjusting the lens strength ratio, the aberration on the optical axis can be reduced. However, since the strength of the projecting lens is large, the beam deflected by the deflector is moved in the direction of the optical axis, and the deflecting efficiency is reduced.

Further, when the half angle $\alpha$ of aperture for the lens is constant, the spherical aberration can be reduced. Since spherical aberration occurs when the beam passes through the periphery of the lens, improvement of the spherical aberration is accomplished simply by short focusing so that the shape of the lens is reduced.

Since the beam passing through the periphery of the lens passes through a shorter route due to the short focusing, the spherical aberration reduces in accordance with the reduction ratio of the shortened route. Further, blurring of the beam caused by the space charge effect can be reduced by short focusing. In this case, the deflection domain is also reduced.

Although the above two methods cannot avoid the reduction of the deflection domain, the aberration on optical axis can be reduced. In the case of a variable rectangular beam wherein the beam current changes greatly, when the rectangle is large, namely, when the beam current is high, the blurring of the beam caused by the space charge is greater than the spherical aberration.

For this reason, short focusing is especially effective. If the reduction of the deflection domain is allowed, the best focusing deflector is obtained by using short focusing instead of changing of the lens strength ratio.

A deflector located in a short focusing lens must be small so that the deflector is included in an inner radius of the polepiece (magnetic pole) of the lens.

Further, in order to increase the deflection efficiency as much as possible, the magnetic field generated by a coil must be strong. For this reason, miniaturization of the coil must be made in consideration of the drifting of the beam position caused by the heating and inductance of the coil.

Before the advent of short focusing, the radius of curvature of the coil was, for example, 20, 24 millimeters or the like, and the focal distance was approximately 200 millimeters.

However, it was known that when the coil is miniaturized, aberration becomes exceedingly large. This phenomenon could not be solved by the prior art theory.

SUMMARY OF THE INVENTION

An object of the present invention is to provide an electron beam exposure system which is small in size and has a saddle type electromagnetic deflector with low aberration.

According to the present invention, there is provided an electron beam exposure system having an electromagnetic lens for forming an arbitrary image with an electron beam and for projecting a condensed version of the image on a sample, and a plurality of saddle type electromagnetic deflectors for deflecting and scanning the electron beam on the sample, wherein at least one of the plurality of saddle type electromagnetic deflectors has a half angle $\theta$ of arc of more than 60 degrees and positions in a vicinity of a smooth connecting line which links four points plotted on a graph having coordinates of the half angle of arc of 60 degrees to no less than a radius of curvature of 30 millimeters, approximately 61.5 degrees to 14 millimeters, approximately 64 degrees to 9 millimeters, and approximately 66 degrees to 7 millimeters.

When the radius of curvature of the saddle type magnetic deflector is no more than 20 millimeters, the aberration is reduced by making the half angle of arc larger than 60 degrees wherein the half angle of the arc is theoretically optimum. The optimum half angle $\theta$ of arc follows the smooth curve which links four points having coordinates of the half angle of arc 60 degrees to no less than a radius of curvature of 30 millimeters, approximately 61.5 degrees to 14 millimeter, approximately 64 degrees to 9 millimeters, and approximately 66 degrees to 7 millimeters, in the relationship between the half angle of arc and the radius of curvature of the deflector coil.

An aberration which is clearly less than that occurring when the half angle of arc is 60 degrees, which is theoretically optimum, can be realized. The domain wherein the smaller aberration is realized is an area including the area near the above smooth line.

Other features and advantages of the invention will be apparent from the following description with reference to the accompanying drawings.

DESCRIPTION OF THE PREFERRED EMBODIMENTS

Figure 1:
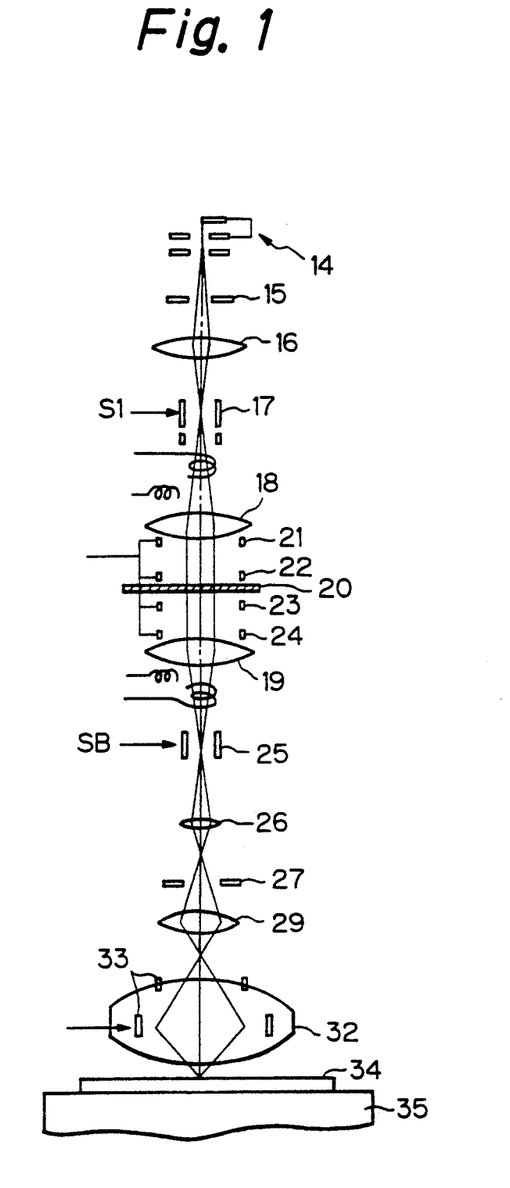
FIG. 1 is a diagram showing an exposure portion of an electron beam exposure system according to a related art of the present invention.

Prior to explaining the embodiments of the present invention, a summary of an exposure portion of an electron beam exposure system to which the invention is applied is explained with reference to FIG. 1.

The exposure portion generates an electron beam, forms the beam into a spot or a pattern, and irradiates the beam on the desired position of an exposure target. Beneath the exposure portion is a stage 35 on which the exposure target (sample) 34 is located.

First, the operation of the exposure portion is explained. The electron beam generated from a cathode electrode is extracted by a grid electrode and an anode electrode. These electrodes are part of an electron beam generating source 14.

The electron beam generated from the electron beam generating source 14 is formed by a first slit 15 (corresponding to the above-mentioned first rectangular aperture) having a rectangular opening, passes through a first electromagnetic lens 16 which converges the electron beam, and arrives at a slit deflector 17 for correcting and changing the position on a block mask 20 (corresponding to the above-mentioned second rectangular aperture) irradiated by the beam. The slit deflector 17 is controlled by a correcting and changing signal S1.

The electron beam passing through the slit deflector 17 further passes through a second electromagnetic lens 18 and a third electromagnetic lens 19 which are arranged so as to face each other; a block mask 20 mounted between these electromagnetic lenses and free to move in the horizontal direction; and an electron beam forming portion including first to fourth deflectors 21 to 24; and thus forms a desired pattern.

The formed electron beam is then either cut off or passes through a blanking electrode 25 to which a blanking signal SB is applied.

The electron beam passing through the blanking electrode 25 is adjusted by a fourth electromagnetic lens 26, an aperture 27 (corresponding to the above-mentioned round aperture), and a fifth electromagnetic lens 29.

The position of the electron beam is further controlled by a sixth electromagnetic lens 32 and a main deflector 33 which position the beam on the sample 34 in accordance with exposure positioning signals, and is then irradiated on the desired position on the sample 34.

The sample 34 is located on the stage 35 which is moveable in X and Y directions.

Next, embodiments according to the present invention are explained in accordance with experiments and analyses which were carried out by the inventors of this invention.

The inventors of this invention made a focusing deflector having an X side four-stage saddle type electromagnetic deflector with a radius of curvature of 7 millimeters, and a Y side four-stage saddle type electromagnetic deflector with a radius of 9 millimeters, and having a focal distance of 90 millimeters between a forward focus and a back focus. In this case, it was confirmed that the aberration on the optical axis was small and the blur due to the space-charge effect was reduced.

However, there was a large amount of aberration when deflecting and particularly it was discovered that the deflection aberration in the X side was considerably larger than that of the Y side. The deflection aberration is designed to be minimized by the combination of angles and locations of the deflectors, however, the errors in the respective parts were not calculated. Accordingly the inventors first believed that the cause of the aberration was the relative increase in error due to the miniaturization of the parts in the respective change of size of the deflector.

Notwithstanding, the deflection aberration was not completely improved by adjusting the deflection angle of each deflector up to ±1 degree and an amount of deflection of each deflector up to ±1%.

The deflection route expressed by a first order function is almost completely correct and the on optical axis aberration was small when the deflection was not carried out, therefore, the inventors expect that a high order component in the deflection exists.

Next, the aberrations when deflecting in the respective coils were examined.

Since the deflection coil generates a homogeneous magnetic field in a direction perpendicular to the optical axis, the saddle type electromagnetic deflection coil is used. If the half angle of arc of the saddle type coil is defined as 60 degrees, it is known that the high order magnetic components are not generated.

Figure 4:
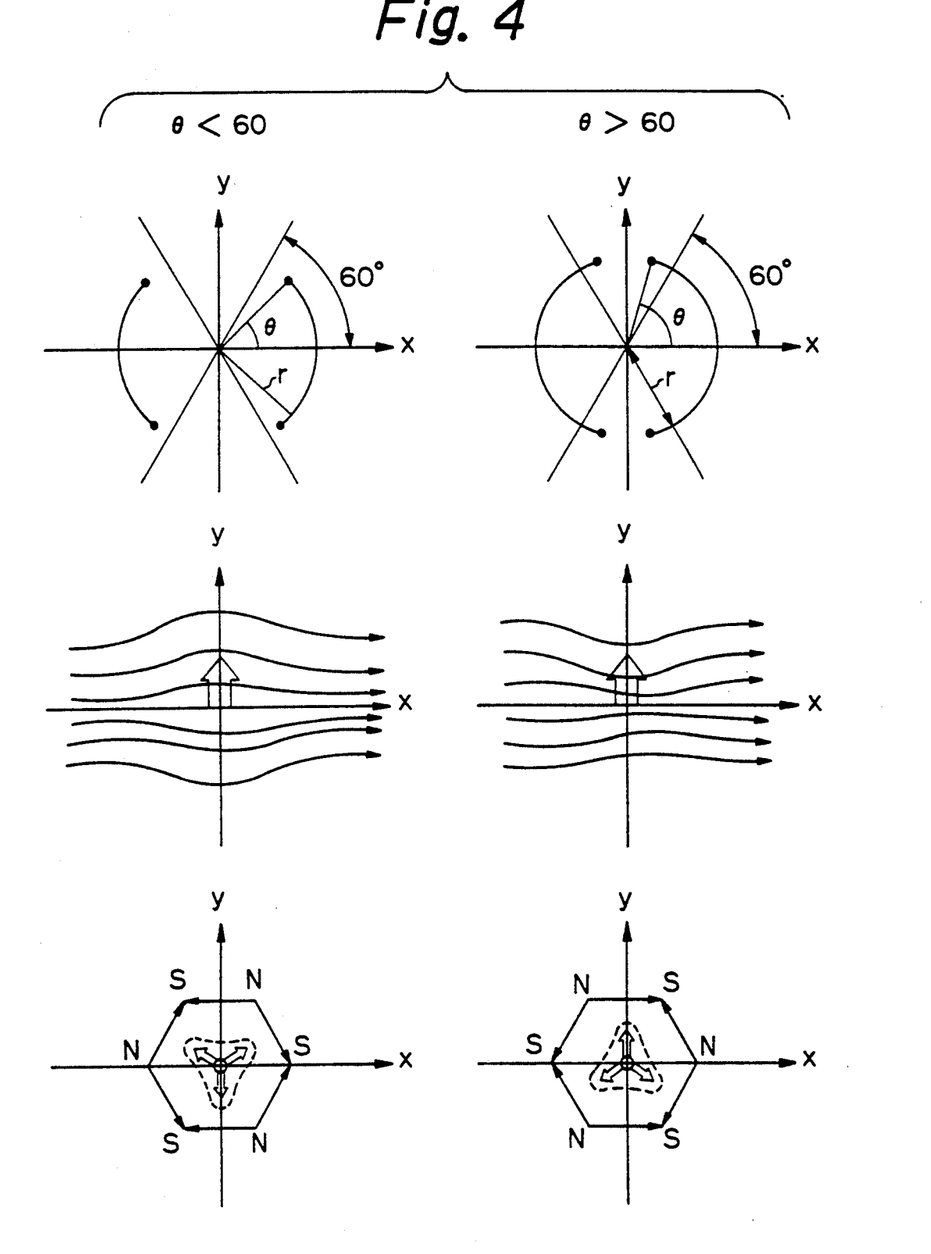
FIG. 4 is a diagram showing characteristics of saddle type deflector coils in the case where a half angle of arc is less than 60 degrees and the case where it is more than 60 degrees.

FIG. 4 is an explanatory diagram showing an effect of the magnetic field on the electron beam when the half angle of arc of the saddle type deflection coil is shifted from 60 degrees. The left side of FIG. 4 shows the case when the half angle $\theta$ of arc is less than 60 degrees, and the right side of FIG. 4 shows the case when the half angle $\theta$ of arc is more than 60 degrees.

As shown in the left side of FIG. 4, when the half angle $\theta$ of arc of the saddle type deflection coil is less than 60 degrees, the generated magnetic field becomes thin at the center, and the lines of magnetic force expand in the center portion. As a result, as shown in the lower portion of the left side of FIG. 4, a six-pole magnetic field component is generated. At this time, the electron beam irradiated on the sample, as shown in the figure, becomes a triangle having a peak in the opposite direction to the beam deflection.

In the right side of FIG. 4, the case when the half angle $\theta$ of arc of the saddle type deflection coil is more than 60 degrees is shown. If the half angle of arc of the coil is more than 60 degrees, as shown in the middle of the right side of FIG. 4, the generated magnetic field becomes dense in the center portion, and the lines of magnetic force contract in the center.

Thus, as shown in the lower portion of the right side of FIG. 4, again the six-pole magnetic component is generated. In this case, the shape of the electron beam irradiated on the sample, becomes a triangle having a peak in the direction of beam deflection, and is an opposite relation to the case on the left side of FIG. 4. Thus, hitherto it was considered that the half angle of arc of the saddle type deflection coil was best at 60 degrees, at which time the shape of the electron beam irradiated on the sample was a circle.

Figure 5:
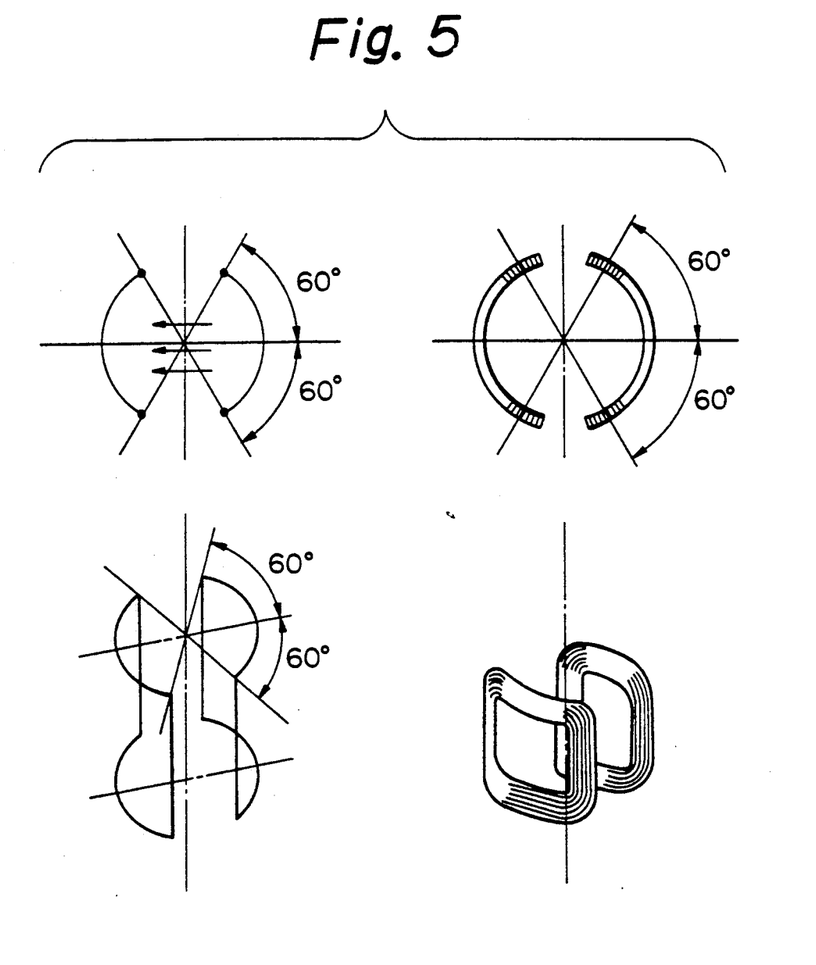
FIG. 5 is a diagram showing the constitution of a deflector coil in FIG. 4.

In FIG. 5 an ideal saddle type deflection coil having a half angle of arc of 60 degrees is shown.

In the upper left side of FIG. 5 a plan view of the ideal saddle type deflection coil is shown. The lower left side of FIG. 5 shows a perspective view of the same. In the case where the coil is a line which has no width, as shown in the upper left side of FIG. 5, a coil having a certain radius of curvature and a half angle of arc of 60 degrees provides an internal homogeneous unidirectional magnetic field.

In the right side of FIG. 5, the saddle type deflection coil actually having the half angle of arc of 60 degrees is shown. The actual coil must be formed using a conductive line having some width. As a result, if it is intended to obtain a predetermined intensity of the magnetic field, the ampere turn must be a predetermined value, and the width of the coil cannot be ignored.

Accordingly, the coil is wound by multiple turns in a circular direction with the optical axis as a center, and the coil is formed so that the center position of the coil has a half angle of arc of 60 degrees. Thus a coil having a certain thickness in the circular direction is formed, and portions having a half angle of arc of more than 60 degrees and the portions having a half angle of arc of less than 60 degrees are obtained.

However it is considered that the high order magnetic components generated from the coil that are less than 60 degrees and more than 60 degrees cancel each other out.

The inventors, as shown in the right side of FIG. 5, wind the plurality of turns as one layer in the radius direction and wind in multiple layers in the optical axis direction and the circular direction around the optical axis, and the center positions of the coil thickness in the circular direction in relation to the optical axis establishes a half angle of 60 degrees. The thus formed saddle type deflection coils were constructed as shown in FIG. 2.

Figure 2:
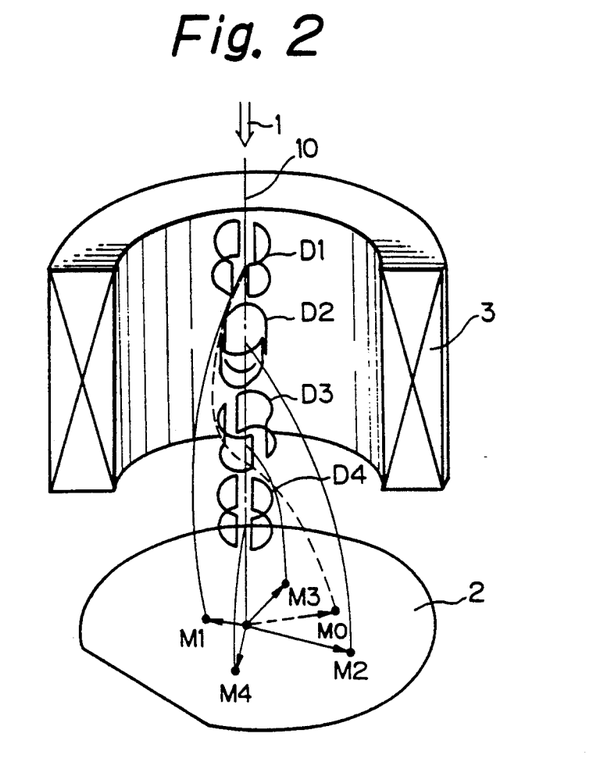
FIG. 2 is a perspective view of a focusing deflector of an embodiment of the present invention.

In FIG. 2, a projection lens 3 was provided for converging the electron beam surrounding the optical axis 10 and the four-stage saddle type deflection coils D1 to D4 were located so as to surround the optical axis 10 inside of the projection lens 3.

Also, the sample 2 which is a semiconductor wafer or the like was located perpendicular to the optical axis 10. The electron beam 1 entering along the optical axis, was converged by the projection lens 3, and was deflected by the saddle type deflection coils D1 to D4.

In addition, the four-stage saddle type deflection coils in the figure correspond to one direction (e.g., X direction), the four-stage saddle type deflection coils corresponding to the other direction (e.g., Y direction) were located concentrically. In FIG. 2, the description of the other four-stage saddle type deflection coils are omitted.

When the saddle type deflection coils D1 to D4 having a small radius of curvature deflected the electron beam, a very large aberration was generated. To investigate the cause of the large aberration, the inventors examined the aberration caused by each of the saddle type deflection coils when the deflection was carried out.

Figure 6:
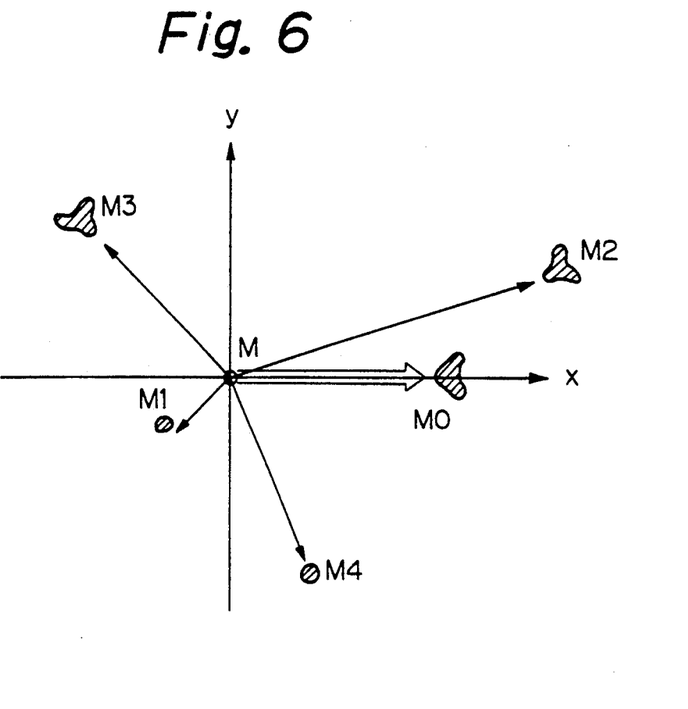
FIG. 6 is a diagram showing an image produced by a saddle type deflector coil having a half angle of arc of 60 degrees.

In FIG. 6, examples of the images using the small saddle type deflection coils having the half angle of arc of 60 degrees are illustrated. When the electron beam was deflected by a first saddle type deflection coil D1, the image M1 was obtained. The image M1 was approximately a circle.

When the electron beam was deflected by only a second saddle type deflection coil D2, the image M2 was obtained, and when the electron beam was deflected by only a third or a fourth saddle type deflection coil, the images M3 and M4 were obtained, respectively.

The images M2 and M3 deflected by the second and third stages were clearly modified and became triangular shaped pointing in the opposite direction of the beam deflection and had a hollow portion in the same direction as the beam deflection. This modification was the same in the case when the half angle of arc was less than 60 degrees.

Further, when all the four-stage saddle type deflection coils operated, the image of the deflected electron beam was shown as M0. The image M0 has characteristics of the images M1 to M4 superimposed.

When the deflection coils do not operate, the electron beam irradiates on the sample as a circle as shown by a center circle M.

However, as shown in FIG. 6, the deflection aberrations due to the second and third stage saddle type deflection coils were very large and in particular astigmatism was quite pronounced. It was discovered that some blurring that remained after correction of the astigmatism was also quite large.

Further, it was discovered that when the focus was shifted slightly, the beam shape did not blur as a circle, but blurred as a triangle as shown in M2 or M3, and the direction of vertex of the triangle coincided with the direction of the beam deflection.

The cause of the triangular blur is considered to be due to the effect of the astigmatism of the correction coil, however, for the above reason, the difference of the aberration between X and Y deflections cannot be explained when the deflection amount is the same.

The blurring of the beam in a triangular shape instead of a circular shape when the focus was shifted slightly is considered to be due to the generation of a 4-pole (astigmatism) magnetic field or 6-pole magnetic field in addition to the 2-pole deflection magnetic field, by the deflectors. The astigmatism is not always generated by the deflector, but sometimes is generated by the passing of the beam through the periphery of the lens. However, it is unlikely that the 6-pole component of the magnetic field is generated by the lens.

Accordingly, the half angle of arc of 60 degrees which was correct theoretically was changed, and the inventors examined how the electron beam changes the shape of the image by the deflection of the saddle type deflection coil.

Figure 7:
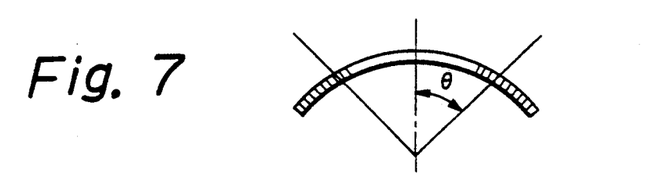
FIG. 7 is a plan view of a saddle type deflector coil having a variable angle of arc.
Figure 8:
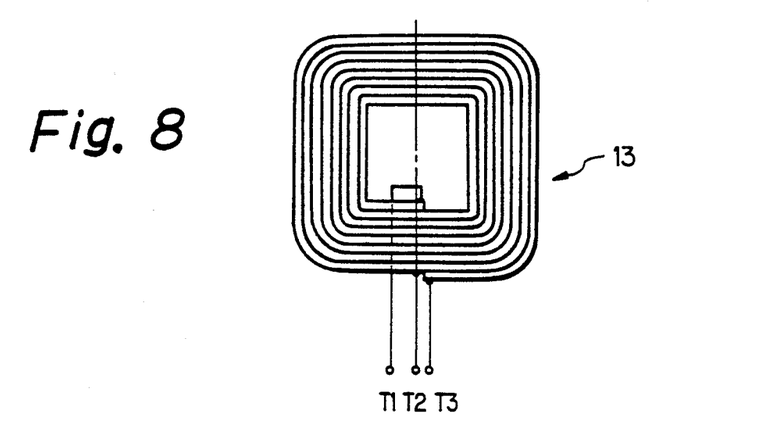
FIG. 8 is an elevation view of the saddle type deflector coil of FIG. 7.

FIG. 7 shows a plan view of the saddle type deflection coil with a variable half angle used in this experiment. FIG. 8 is an elevation view thereof. The saddle type deflection coil 13 is formed as a continuous coil. Terminals T1 and T3 are connected at opposite ends, and an intermediate terminal T2 is formed just one turn inside of the outermost coil.

If the terminals T1 and T2 are connected to a power source, the outermost coil does not operate, and a coil that is smaller by one turn than the actual size is formed. Accordingly the half angle of arc becomes smaller.

If the terminals T1 and T3 are connected to the power source, then current flows through the outermost part of the saddle type deflection coil 13, and a saddle type deflection coil having a size shown in the figure is realized. In this case, the half angle become larger corresponding to the size of the coil.

Further, a current I flows when a power source is connected to the terminals T1 and T2, and a different current Ia flows when another power source is connected to the terminals T2 and T3, so that the half angle of arc of the coil can ge changed. It is obvious that the intermediate terminal may be provided anywhere inside the coil, and the position of the intermediate terminal may be changed.

Figure 9:
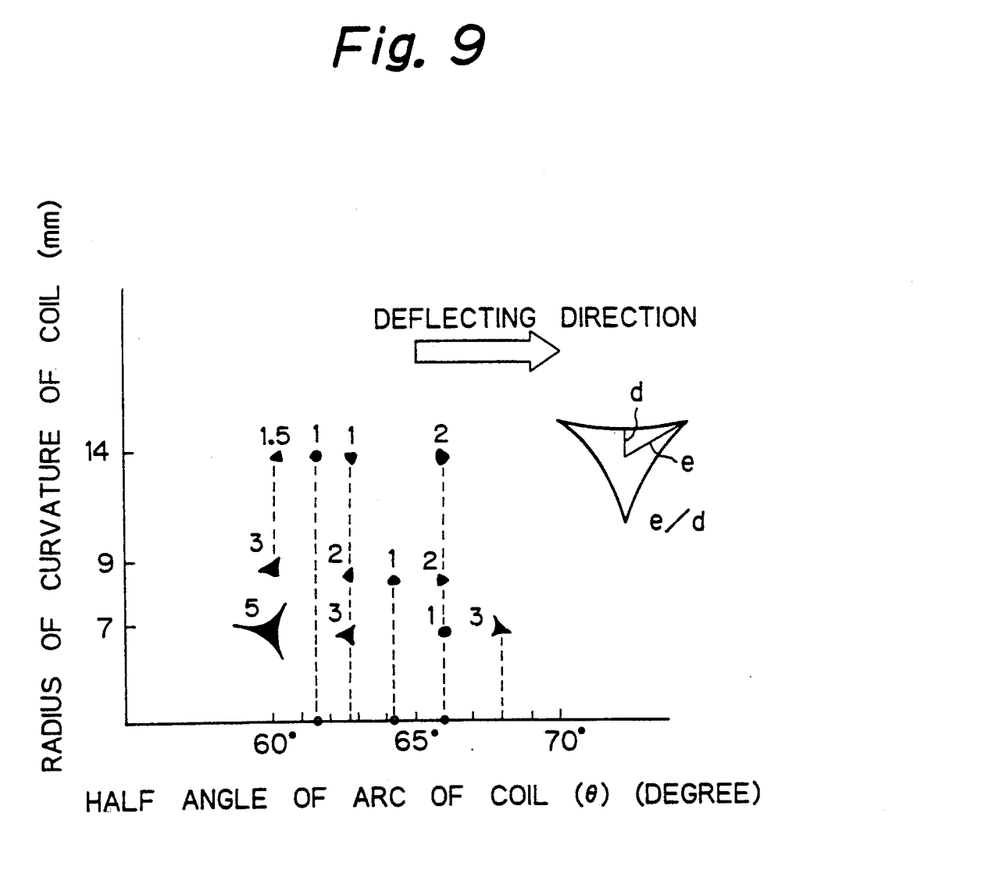
FIG. 9 is a graph showing a relationship between a radius of curvature and a half angle of arc of a deflector coil.

FIG. 9 is a graph showing beam shapes when the radius of curvature of the saddle type deflection coil is made to be less than 20 millimeters and the electron beam is deflected by various values of the half angle of arc. The plots in the figure are measured points, and the numerals attached to the points designate a ratio e/d of a long radius e and a short radius d as shown at the right side in the figure when the shape of the electron beam changes to a triangle.

For example, when the radius of curvature of the coil is 14 millimeters, if the half angle of arc of the coil is approximately 62 degrees, the shape of the beam is approximately a circle, and this is optimum. On the other hand, in the half angle of arc of 60 degrees which was hitherto an ideal value, the beam shape is modified to a triangle, and the ratio of long radius to short radius is approximately 1.5.

When the half angle of arc of the coil is set to a larger value, e.g., 66 degrees, the beam shape becomes a triangle projecting in the opposite direction, and the ratio of long radius to short radius increases to 2.

If the radius of curvature of the coil is approximately 9 millimeters and the half angle of arc is approximately 64 degrees, the beam shape is optimum, and the ratio of long radius to short radius becomes approximately 1. If the half angle of arc is 60 degrees which was hitherto an ideal value, the ratio of long radius to short radius becomes 3, and a large aberration results.

When the half angle of arc is approximately 62.5 degrees or 66 degrees, a slight aberration is recognized and the beam shape becomes a triangle, the ratio of long radius to short radius is approximately 2, and a clear difference is discovered is comparison with the case where the half angle of arc is 60 degrees.

When the radius of curvature of the coil is 7 millimeters, if the half angle of arc of the coil is set at 60 degrees which was hitherto an ideal value, the ratio of long radius to short radius becomes 5, which is a very large value. If the half angle of arc is approximately 66 degrees, the beam shape becomes approximately a circle and the ratio of long radius to short radius is approximately 1.

Further, if the half angle of arc of the coil is approximately 62.5 degrees or approximately 68 degrees, the ratio of long radius to short radius becomes approximately 3, and a clear improvement is recognized in comparison with the case of the half angle of arc of 60 degrees.

As mentioned above, if the radius of curvature of the coil is less than 20 millimeters, the half angle of arc of the coil of 60 degrees which was hitherto an ideal value actually results in a large aberration, and it can be clearly seen that the half angle of arc of more than 60 degrees is preferable.

Figure 3:
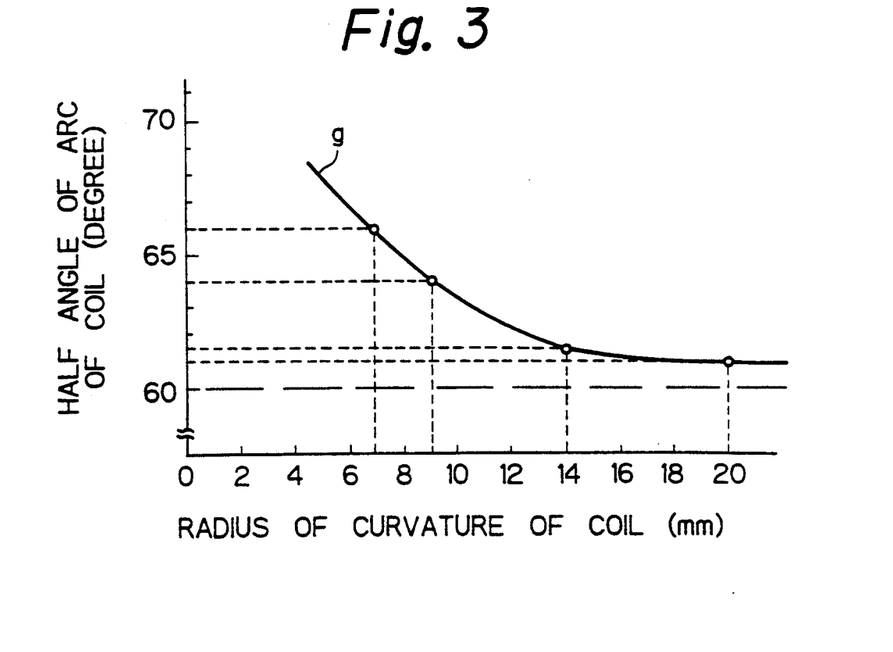
FIG. 3 is a graph showing the most appropriate relationship between a half angle of arc and a radius of curvature of a coil of the saddle type electromagnetic deflector.

FIG. 3 is a graph showing a curve g which designates the most appropriate value of the relation of the half angle of arc to the radius of curvature of the coil. The curve g represents the ideal values, with the clearly improved range of the half angles of arc distributed along both sides thereof.

As explained above, in the electron beam exposure system, when the radius of curvature of the saddle type electromagnetic deflector is made smaller than 20 millimeters, the generation of aberration can be reduced by making the half angle of arc of the coil a predetermined value greater than 60 degrees.

Although the present invention is explained by way of embodiments, the invention is not limited by the embodiments, and it is obvious for a person skilled in the art that various changes, improvements, combinations or the like are possible without departing from the scope and spirit thereof.

We claim:

1. An electron beam exposure system having an electromagnetic lens for forming an arbitrary image with an electron beam and for projecting a condensed version of the image on a sample, and a plurality of saddle type electromagnetic deflectors for deflecting and scanning the electron beam on the sample, wherein
at least one of the plurality of saddle type electromagnetic deflectors has a half angle $\theta$ of arc of more than 60 degrees and positions in a vicinity of a smooth connecting line which links four points plotted on a graph having coordinates of the half angle of arc of 60 degrees to no less than a radius of curvature of 30 millimeters, approximately 61.5 degrees to 14 millimeters, approximately 64 degrees to 9 millimeters, and approximately 66 degrees to 7 millimeters.

2. An electron beam exposure system as set forth in claim 1, wherein
at least one of said plurality of saddle type electromagnetic deflectors has a radius of curvature of no more than 20 millimeters surrounding an optical axis.

3. An electron beam exposure system as set forth in claim 1, wherein
the value of the half angle of arc of at least one of said saddle type electromagnetic deflectors is selected from a range of 61 degrees to 66 degrees.

4. An electron beam exposure system as set forth in claim 3, wherein
at least one of said saddle type electromagnetic deflectors has at least one intermediate tap in addition to terminals at opposing ends thereof, whereby the effective half angle of arc is made variable.

5. An electron beam exposure system as set forth in claim 4, wherein
said radius of curvature and said half angle of arc of said saddle type electromagnetic deflectors are selected so that the ratio of a long radius to a short radius in the approximately circular electron beam image on the sample is no more than 1.5.

6. An electron beam exposure system as set forth in claim 3, wherein
said radius of curvature and said half angle of arc of said saddle type electromagnetic deflectors are selected so that the ratio of a long radius to a short radius in the approximately circular electron beam image on the sample is no more than 1.5.

7. An electron beam exposure system as set forth in claim 1, wherein
at least one of said saddle type electromagnetic deflectors has at least one intermediate tap in addition to terminals at opposing ends thereof, whereby the effective half angle of arc is made variable.

8. An electron beam exposure system as set forth in claim 7, wherein
said radius of curvature and said half angle of arc of said saddle type electromagnetic deflectors are selected so that the ratio of a long radius to a short radius in the approximately circular electron beam image on the sample is no more than 1.5.

9. An electron beam exposure system as set forth in claim 1, wherein
said radius of curvature and said half angle of arc of said saddle type electromagnetic deflectors are selected so that the ratio of a long radius to a short radius in the approximately circular electron beam image on the sample is no more than 1.5.

* * * * *